United States Patent [19]

Ishizaka

[11] Patent Number: 5,257,267
[45] Date of Patent: Oct. 26, 1993

[54] VARIABLE LENGTH SCAN STRING AND CELL FOR SAME

[75] Inventor: Yoshiyuki Ishizaka, Tokyo, Japan

[73] Assignee: Advanced Micro Devices, Inc., Sunnyvale, Calif.

[21] Appl. No.: 660,532

[22] Filed: Feb. 25, 1991

[30] Foreign Application Priority Data

Feb. 26, 1990 [JP] Japan .................. 2-47099

[51] Int. Cl.⁵ .......................................... G01R 31/28
[52] U.S. Cl. ................................................ 371/22.3
[58] Field of Search ................. 371/22.3; 324/158 R

[56] References Cited

U.S. PATENT DOCUMENTS

| | | | |
|---|---|---|---|
| 4,680,733 | 7/1987 | Duforestel et al. | 371/22.3 |
| 4,847,839 | 7/1989 | Hudson, Jr. et al. | 371/22.4 |
| 4,872,169 | 10/1989 | Whetsel, Jr. | 371/22.3 |
| 4,897,837 | 1/1990 | Ishihara et al. | 371/22.3 |
| 4,914,379 | 4/1990 | Maeno | 371/22.3 |
| 4,995,039 | 2/1991 | Sakashita et al. | 371/22.3 |
| 5,130,647 | 7/1992 | Sakashita et al. | 324/158 R |
| 5,150,044 | 9/1992 | Hashizume et al. | 324/158 R |

FOREIGN PATENT DOCUMENTS 0151653 8/1985 European Pat. Off. .

*Primary Examiner*—Charles E. Atkinson
*Attorney, Agent, or Firm*—Fliesler, Dubb, Meyer & Lovejoy

[57] ABSTRACT

A register circuit for scan path testing is provided and comprises a shifting means for shifting the data signal provided to the input means to the output means in response to a clock signal, a controllable connection means for connecting the input means and the output means, and a storage means for storing an enabling signal to enable the connection means. Preferably, the connection means will connect the input means to the output means in response to the enabling signal stored in the storage means when it is not necessary to apply data signals to the shifting means. Therefore, the data signal applied to the input means is provided to the output means without any delay in time via the connection means. As a result, the scan input of the data signal from scan path may be accomplished in a short time.

13 Claims, 7 Drawing Sheets

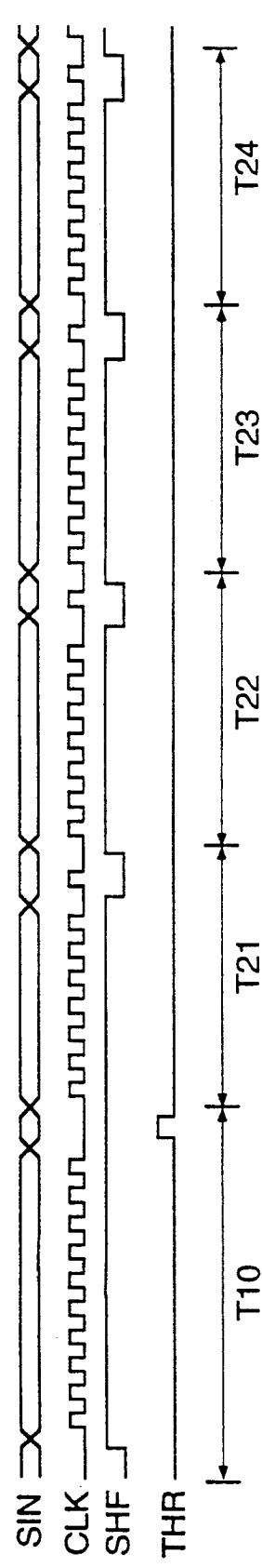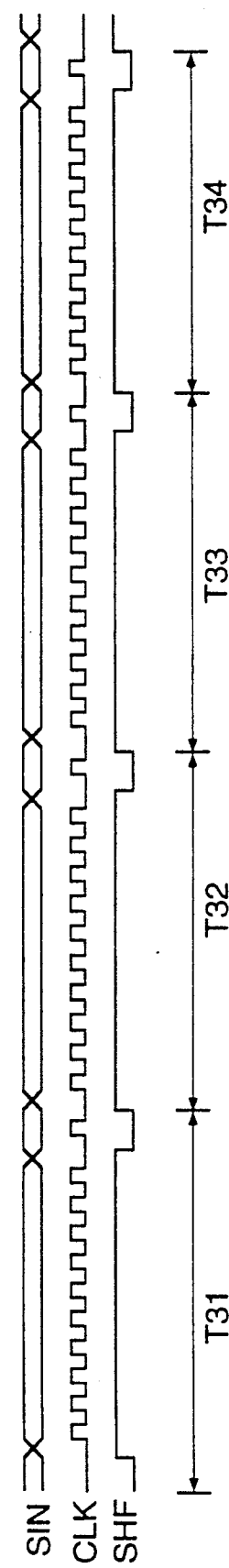

VARIABLE LENGTH SCAN STRING AND CELL FOR SAME

CROSS-REFERENCE TO RELATED APPLICATION

This application claims priority to Japanese Patent Application Serial No. 02-47099, filed Feb. 26, 1990, inventor, Yoshiyuki Ishizaka.

BACKGROUND OF THE INVENTION

1. Field of the Invention

The invention generally relates to the testing of circuits provided in semiconductor integrated circuits or printed boards, and more particularly, to a register circuit for scan path testing to reduce the required time for testing under a serial scan method.

2. Description of the Related Art

Scanning methods are available for the purpose of testing circuits provided in semiconductor integrated circuit or printed boards. The scanning methods include a serial scan method and a parallel scan method. Under the serial scan method, a continuous shift register is previously provided within the circuit whereby that shift register will be externally accessed at the time of testing. By access to the shift register, test data may be applied to the desired circuit portion to be tested within the circuit, and/or data indicating the processing result from the circuit portion to be tested may be externally provided via the shift register.

In general, hundreds to thousands of test data are applied to the circuit to be tested in order to determine whether the circuit to be tested is normal or not, with test data indicating the test result provided for each applied test data. In the above-mentioned serial scan method, the input and output of test data are performed serially by a clock signal, causing an increase in the total time required for testing as the number of test data, i.e., the number of testing increases.

FIG. 5 is a block diagram showing a semiconductor integrated circuit (or a printed board) comprising the circuits to be tested. Referring to FIG. 5, a semiconductor integrated circuit 100 comprises circuit portions to be tested (under-test circuits) 20, 40 and 60, other circuit portions which do not require testing 30 and 50, and shift register cells 1–10 for implementing serial scan path testing. The desired circuit is formed by the combination of each circuit portion 20, 30, 40, 50 and 60. Registers formed of cells 1–10 implement the shift register at the time of testing by the serial scan method. During normal operation, plural registers formed by cells 1–3, 4–5, 6–7 and 8–10 are used as the required registers for transferring signals between circuit portions 20–60. Therefore, these cells 1–10 are used as a shift register for testing before shipment of IC 100 from the factory, while being used as registers for normal operation by users after shipment.

FIG. 6 is circuit diagram of a conventional cell 1b. Referring to FIG. 6, the cell 1b comprises a selector 11 responsive to a shift control signal SHF for selecting either a scan input SIN or a data input DIN, and a D-type flip flop 12 operative in response to clock signal CLK. The output data Q from the flip flop 12 is applied to a scan output SOUT and a data output DOUT. In order to constitute the shift register of FIG. 5 using a plurality of cells b as shown in FIG. 6, the cells 1–10 are cascaded via the scan input SIN and the scan output SOUT of each cell 1b. When the cell 1b is to be used as an independent data holding circuit, the cell 1b is connected to another circuit via the data input DIN and the data output DOUT. The selector 11 responds to a shift control signal SHF to selectively provide data applied to either the scan input SIN or the data input DIN to the flip flop 12.

FIG. 7 is a circuit connection diagram showing the connection of the cell 1b shown in FIG. 6 in a semiconductor integrated circuit. Referring to FIG. 7, three cells 1b, 2b and 3b connect between a circuit to be tested 20 and another circuit 30 as shown. Cell 1b is the circuit configuration shown in FIG. 6. The other cells 2b and 3b also have a similar circuit configuration. For the implementation of the serial scan path the scan output SOUT of the cell 1b is connected to the scan input SIN of the cell 2b. The connection between cells 2b and 3b are also provided in the likewise manner. Each of cells 1b, 2b and 3b has each data input DIN connected so as to receive data from the circuit to be tested 20, and its data output DOUT connected to the other circuit 30. Although not shown, the other cells 4–10 in a semiconductor integrated circuit 100 according to FIGS. 5 and 6 are connected in a likewise manner shown in the circuit of FIG. 7.

Now, the operation of a circuit having cells according to FIG. 6 will be described. In the following description, it is assumed that the circuit portions 20, 40 and 60 of FIG. 5 need be tested but circuit portions 30 and 50 do not need to be tested. First, a shift control signal SHF is applied to each of cells 1–10. The selector 11 provided in each of cells 1–10 responds to the signal SHF for providing the data applied to the scan input SIN to the flip flop 12. As a result, a shift register is configured by shift cells 1–10. Test data is inputted via the configured shift register. After test data is inputted, each circuit portion 20–60 is operated. Following the operation, the data indicating the result of the test is provided to cells 1–7. Since cells 8–10 are not connected to the circuits to be tested, data indicating the result of the test will not be provided to these cells. The data indicating the result of the test held in each cell 1–7 respond to a clock signal CLK to be outputted from the configured shift register.

PROBLEM TO BE SOLVED BY THE INVENTION

In order to provide all the data retained in the shift register configured by 10 cells 1–10 as shown in FIGS. 5 and 6, at least 10 pulses of the clock signal CLK are necessary. The number of the necessary pulses does not depend on the number of bits only in the data required for indicating the test result. They are instead determined by the number of cells configuring the shift register. In the above-mentioned embodiment of FIGS. 5 and 6, at least 10 pulses of the clock signal CLK are required to provide all the data indicating the test result, though the required data indicating the test results are retained in only cells 1–7. This means that a time length corresponding to 10 clock periods of the clock signal CLK is required to scan output one test pattern data. Consequently, conventional circuits require a time length longer than the necessary time causing an increase in the resulting testing time.

The above-mentioned description will be more clearly understood when referred to FIG. 8. In FIG. 8, the varying timings of the scan input signal SIN, the clock signal CLK, and the shift control signal SHF for scan input/output of the test data are shown. At time period T31, a first test pattern data is provided. At time period T32, the scan output of the data indicating the test result based on the first test pattern data, and the scan input of a second test pattern data are carried out simultaneously. Similarly, the scan output of the data indicating the test result and the scan input of a third and a fourth test pattern data are respectively performed simultaneously at time periods T33 and T34. In FIG. 8, the time necessary for the circuit to be tested to operate in accordance with the provided test pattern data is omitted.

Thus, it can be presumed from FIG. 8 that in the event of 100 test patterns, for example, used for the testing, a time length corresponding to the number of clocks CL1 as given in the following equation is necessary for the scan input and the scan output.

$$CL1 = 10 \text{ (clocks)} \times 101 \quad (1)$$
$$= 1010 \text{ (clocks)}$$

The present invention was made to solve the above problem with an object of providing a register circuit to reduce the required testing time under a serial scan method.

SUMMARY OF THE INVENTION

The cell circuit for scan path testing in accordance with the present invention comprises a shifting means for shifting the data signal provided to the input means to the output means in response to a clock signal, a controllable connection means for connecting the input means and the output means, and a storage means for storing an enabling signal to enable the connection means.

EFFECT OF THE INVENTION

In the inventive cell circuit for scan path testing, the connection means will connect the input means to the output means in response to the enabling signal stored in the storage means when it is not necessary to apply data signals to the shifting means. Therefore, the data signal applied to the input means is provided to the output means without any delay in time via the connection means. As a result, the scan input of the data signal from scan path may be accomplished in a short time.

BRIEF DESCRIPTION OF THE DRAWINGS

FIG. 4 is a timing diagram showing the application of the register of FIG. 1 to the semiconductor integrated circuit of FIG. 5.

FIG. 8 is a timing diagram showing the application of the cell of FIG. 6 to the semiconductor integrated circuit of FIG. 5.

In the figures, 11 is a selector, 12 is a D-flip-flop, 13 is a selector, 14 is a latch circuit, 20, 40 and 60 are circuits to be tested, 30 and 50 are other circuits.

DESCRIPTION OF THE PREFERRED EMBODIMENT

Figure 1:
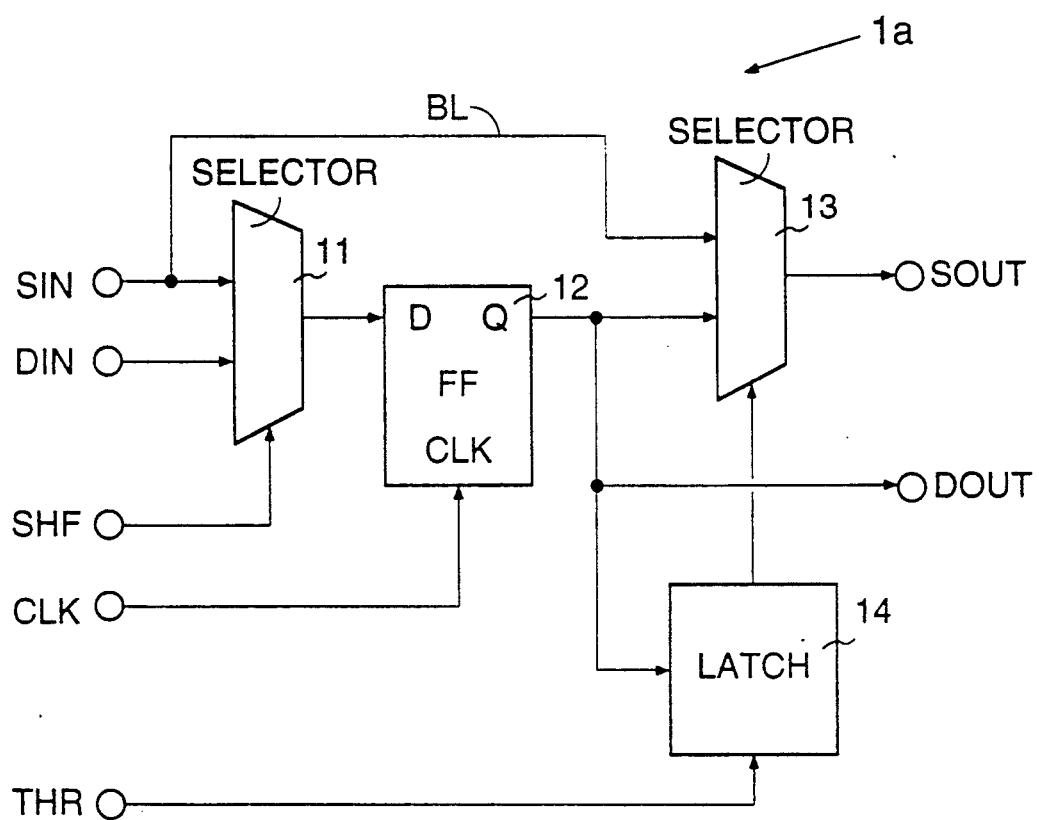
FIG. 1 is a circuit diagram of a cell in a register circuit for scan path testing showing an embodiment of the present invention.

FIG. 1 is a circuit diagram of a cell 1a in a register circuit for scan path testing showing an embodiment of the invention. Referring to FIG. 1, cell circuit 1a comprises a selector 11 responsive to a shift control signal SHF for selecting either a scan input SIN or a data input DIN, a D-type flip flop 12 responsive to a clock signal CLK for operating, a selector 13 for selecting either the data applied to the scan input SIN or the output data from the flip flop 12, and a latch circuit 14 for holding a signal controlling the selector 13. The selector 13 has one input connected so as to receive the output data Q from the flip flop 12. A bypass line BL is connected between the other input of the selector 13 and the scan input SIN.

Figure 2:
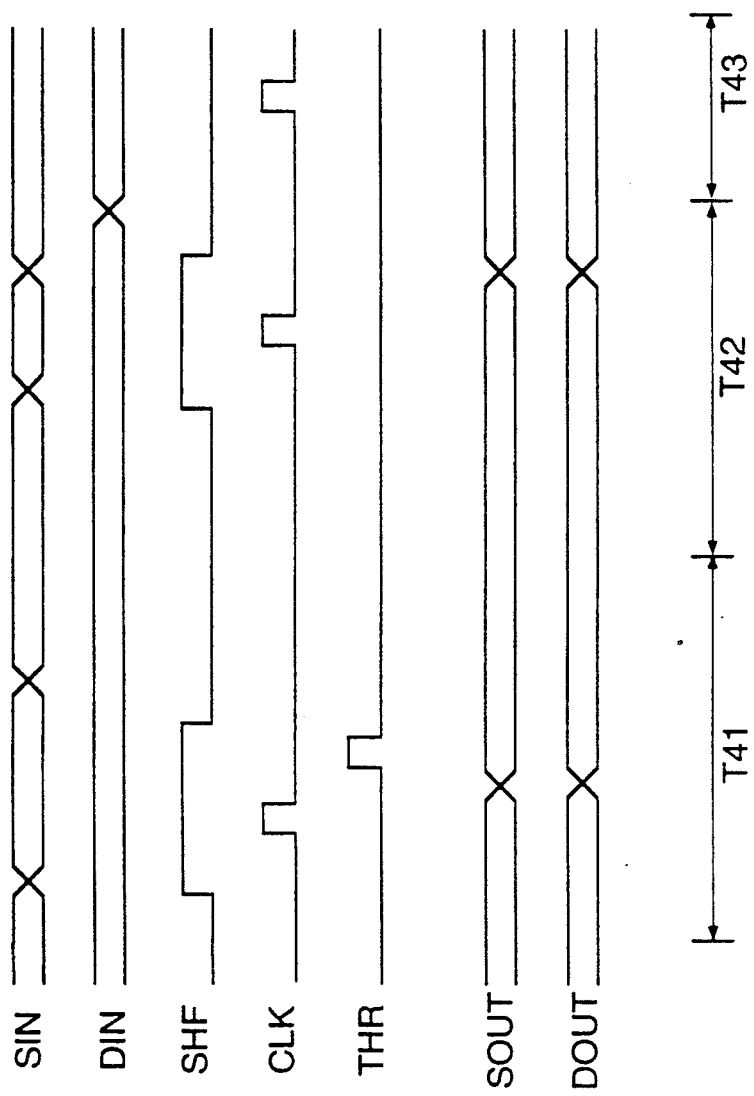
FIG. 2 is a timing diagram for explaining the operation of the circuit of FIG. 1.

FIG. 2 is a timing diagram for describing the operation of the circuit shown in FIG. 1. Referring to FIG. 2, a control signal is written to the latch circuit 14 at time period T41. That is, a shift control signal SHF of the high level is applied to the selector 11 to provide a control signal which will be applied to the scan input SIN to the latch circuit 14 via the selector 11 and the flip flop 12. The latch circuit 14 holds the applied control signal in response to a signal THR which instructs the holding. The control signal held in the latch circuit 14 is provided to the selector 13. The selector 13 selects the data applied to the scan input SIN in response to the applied control signal for providing to the scan output SOUT.

At time period T42, a shift operation is carried out using the bypass line BL. That is, the data applied to scan input SIN is directly provided to scan output SOUT via the bypass line BL and the selector 13.

At time period T43, the normal operation using the flip flop 12 is performed. The selector 11 provides the data applied to data input DIN to the flip flop 12 in response to a low level shift control signal SHF. The flip flop 12 operates in response to clock signal CLK. The data output from the flip flop 12 is provided via the terminal DOUT.

Figure 3:
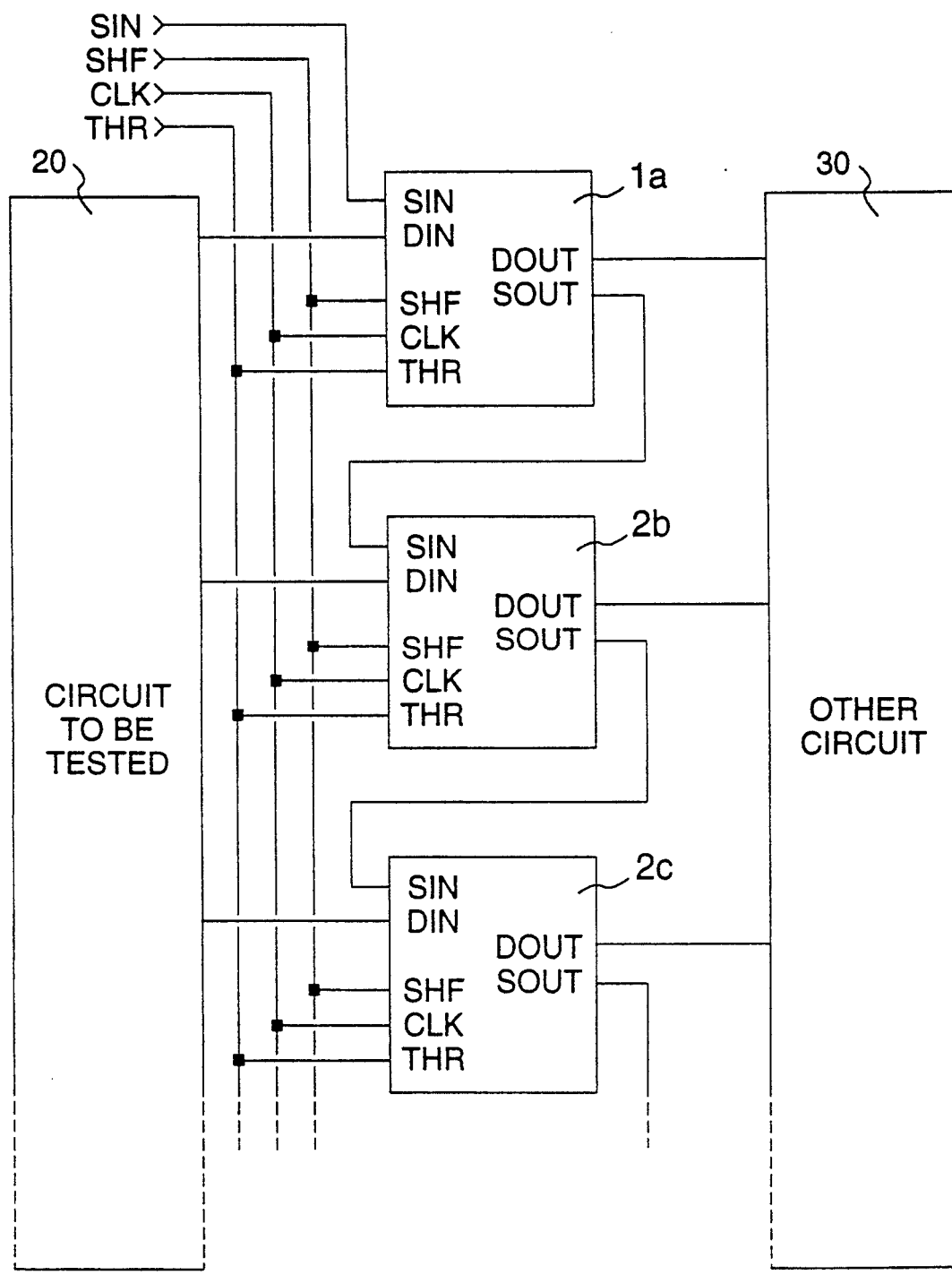
FIG. 3 is a circuit connection diagram showing the connection of the register of FIG. 1 in a semiconductor integrated circuit.
Figure 7:
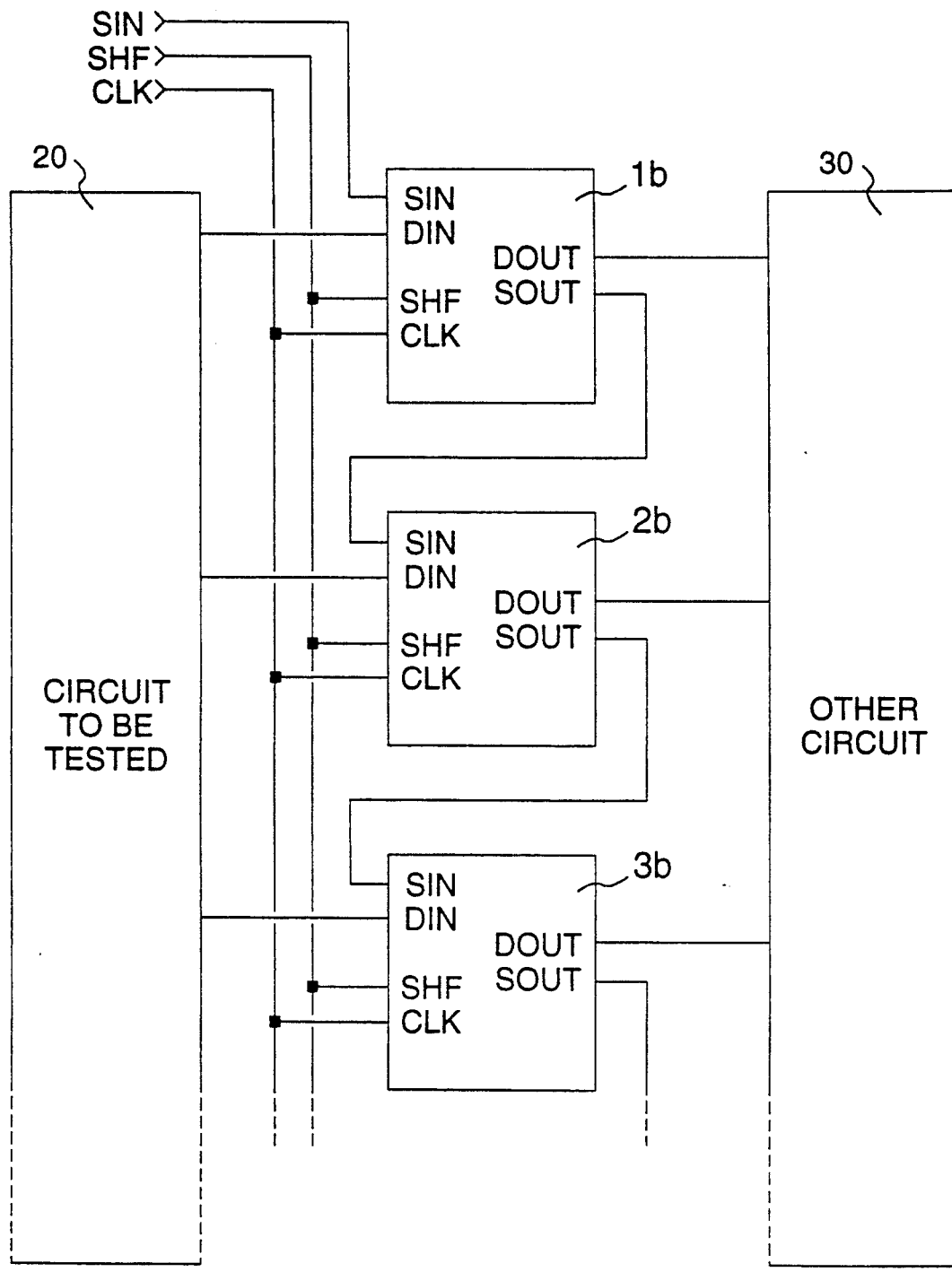
FIG. 7 is a circuit connection diagram showing the connection of the cell of FIG. 6 in a semiconductor integrated circuit.

FIG. 3 is a circuit connection diagram showing the connection of the cells shown in FIG. 1 in a semiconductor integrated circuit. Referring to FIG. 3, the difference in comparison with the conventional circuit connection of FIG. 7 is that a control signal THR for controlling the holding of the data by the latch circuit 14 is provided to each of cells 1a, 2b and 2c. The description of other circuit connection will be omitted since it is similar to that shown in FIG. 7. By adapting the cell 1a of FIG. 1 to the cells 1-10 in the semiconductor integrated circuit 100 of FIG. 5, the following advantages will be obtained. It is assumed that circuit portions 20, 40 and 60 need be tested, while circuit portions 30 and 50 need not be tested in the following description.

Figure 5:
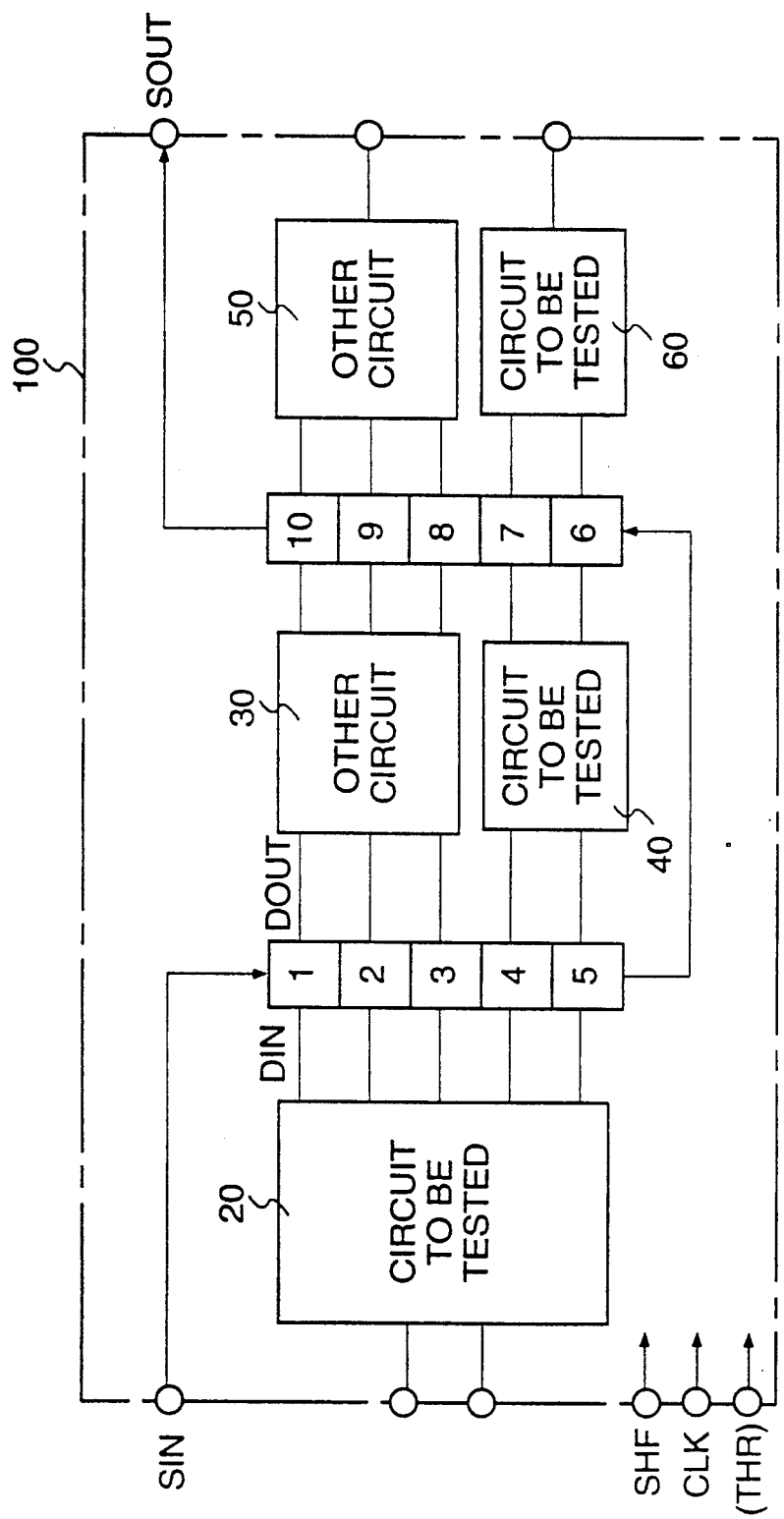
FIG. 5 is a block diagram of a semiconductor integrated circuit comprising circuits to be tested.

It can be understood from FIG. 5 that a high level control signal is written into the latch circuit 14 of each cells 8, 9 and 10, since no circuits to be tested are connected to cells 8, 9 and 10. This causes the scan input SIN and the scan output SOUT of each cells 8, 9 and 10 to be connected via the bypass line BL and the selector 13. Thus, 10 clock pulses are necessary to write a control signal for the high level into the latch circuit 14 provided in each of cells 1-10.

After the control signal is written into the latch circuit 14, i.e., after the provision of the control signal, the testing of the circuit portions to be tested 20, 40 and 60 shown in FIG. 5 is performed based on the test pattern data. The scan input/output of the test pattern data is carried out for each test pattern data. As previously mentioned, each cell 8-10 of the ten cells 1-10 configuring the shift register has the scan input SIN connected to the scan output SOUT via bypass line BL. Therefore, after the testing operation is completed with respect to one test data, seven pulses of the clock signal CLK are sufficient to output all the data indicating the test result. In other words, the number of pulses of the clock signal required for the scan output of data indicating the test result is equivalent to the number of cells 1-7 holding the data indicating the test result. Accordingly, the number of pulses of clock signal CLK used in scan input and scan output of the required test pattern data for each test pattern data may be reduced. This means that the time required for testing under a serial scan method is shortened.

The time length required to write control signals into the latch circuit 14 provided in each of cells 1-10 and for scan input/output is shown in the timing diagram of FIG. 4. Referring to FIG. 4, a control signal is written into the latch circuit 14 at time period T10. Then, the scan input of the test pattern data and/or the scan output of the data indicating the test result are performed at time periods T21-T24. Ten pulses of the clock signal CLK will be necessary at time period 10, while seven clock pulses will be necessary at each time period T21-T24.

Thus, the required total number of clock pulses including the clock pulses to set the latch circuit 14 when a testing is carried out in accordance with 100 test pattern data for example, will be represented as in the following equation.

$$CL2 = 10 \text{ (clocks)} + 7 \text{ (clocks)} \times 101 \quad (2)$$
$$= 717 \text{ (clocks)}$$

Figure 6:
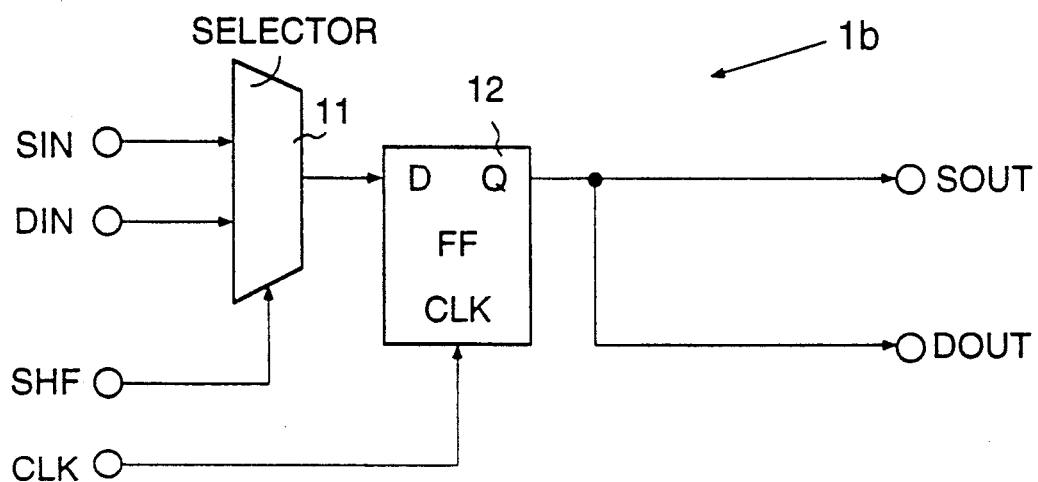
FIG. 6 is a circuit diagram of a conventional cell.

It is appreciated that the time corresponding to 717 clocks for carrying out the testing with 100 test pattern data will be necessary for the scan input and the scan output when the cell 1a of FIG. 11 is adapted to the cells 1-10 in the semiconductor integrated circuit 100 of FIG. 5. In comparison to the application of the cell 1b shown in FIG. 6, i.e., by comparing equation (1) to equation (2), it is noted that the number of clock pulses of the clock signal CLK is approximately 30% reduced.

Though the above description has been given with a shift register configured by 10 cells 1-10, it is obvious that the cell 1a shown in FIG. 1 is applicable to a shift register exceeding ten stages.

Also, it is understood that the cell to have the scan input SIN and the scan output SOUT connected by the bypass line BL is selected in accordance with the number of circuits to be tested and the location thereof. It should be noted that the present invention is applicable to not only a semiconductor integrated circuit, but a printed board.

ADVANTAGE OF THE INVENTION

In accordance with the present invention, connection means for connecting input means to output means in response to an enabling signal stored in a storage means is provided to achieve a register circuit for scan path testing which can shorten the time required for testing under a serial scan method.

I claim:

1. A variable length, serial scan string having a plurality of serial scan cells coupled in series to define said serial scan string, at least one of the serial scan cells comprising:
a scan-in node for receiving first serial scan data, the first serial scan data including a bypass control signal;
a scan-out node for outputting second serial scan data;
a flip flop having an input operatively coupled to receive the first serial scan data from the scan-in node and an output for outputting a time delayed version of the first serial scan data received at the flip flop input;
a controllable scan-out selector having a first input coupled to the scan-in node, a second input coupled to the flip flop output, a control terminal, and an output coupled to the scan-out node for selectively outputting to the scan-out node a selected one of first and second signals respectively applied to the first and second scan-out selector inputs in response to a scan-out control signal supplied to the scan-out selector control terminal; and
scan-out selector control means, operatively coupled to the scan-in node and to the controllable scan-out selector, for receiving the bypass control signal from the scan-in node and for outputting the received bypass control signal to the control terminal of the controllable scan-out selector as said scan-out control signal.

2. The variable length, serial scan string of claim 1 wherein the scan-out selector control means consists essentially of an unclocked, bypass control latch having an input connected to the flip flop output for receiving the bypass control signal from the flip flop output for storage in the bypass control latch, an output for outputting a stored bypass control signal as the scan-out control signal to the controllable scan-out selector, and said control terminal for receiving a load-and-hold instruction signal, said load-and-hold instruction signal causing the bypass control latch to load-and-store the bypass control signal output by the flip flop output.

3. A variable length, serial scan string according to claim 2 wherein the scan string has plural serial scan cells each with the structure recited in claim 2.

4. The variable length, serial scan string of claim 3 wherein the control terminals of the plural serial scan cells receive a common load-and-hold instruction signal.

5. The variable length, serial scan string of claim 3 wherein the flip flops of the plural serial scan cells are clocked flip flops all receiving a common clock signal.

6. The variable length, serial scan string of claim 6 wherein the scan-out selector control means includes a bypass control latch having an input connected to the flip flop output for receiving the bypass control signal from the flip flop output for storage in the bypass control latch, an output for outputting a stored bypass control signal as the scan-out control signal to the controllable scan-out selector, and a control terminal for receiving a load-and-hold instruction signal, said load-and-hold instruction signal causing the control latch to load-and-store the bypass control signal output by the flip flop output.

7. The variable length, serial scan string of claim 1 wherein the at least one serial scan cell further comprises:
- a data-in node for receiving data from a first circuit part outside the serial scan string;
- a data-out node for outputting data to a second circuit part outside the serial scan string, said data-out node being operatively coupled to the flip flop output;
- a controllable scan-in selector having a first input coupled to the scan-in node, a second input coupled to the data-in node, a control input, and an output coupled to the flip flop input, for selectively outputting to the flip flop input a selected one of first and second signals respectively applied to the first and second scan-in selector inputs in response to a selector shifting signal supplied to said control input.

8. The variable length, serial scan string of claim 7 wherein the scan string has plural serial scan cells each with the structure recited in claim 7 and wherein the control inputs of the plural serial scan cells receive a common selector shifting signal.

9. The variable length, serial scan string of claim 7 wherein the scan string has plural serial scan cells each with the structure recited in claim 7 and wherein:
- the data-in nodes of at least two such cells are respectively coupled to corresponding first circuit parts;
- the bypass control signal designates one of more of the corresponding first circuit parts as circuit part that are not to be tested; and
- the bypass control signal further directs the scan-out selector control means in each cell whose first circuit part is designated as one not to be tested to output a scan-out control signal selecting the first signal applied to the first scan-out selector input as the signal to be output by the output of the controllable scan-out selector.

10. A variable length, serial scan string having a plurality of serial scan cells coupled in series to define said serial scan string, each of the serial scan cells comprising:
- a scan-in node for receiving first serial scan data, the first serial scan data including a bypass control signal;
- a scan-out node for outputting second serial scan data;
- a clock-input node for receiving clock pulses;
- serial shift means, responsive to said clock pulses, the serial shift means having an input operatively coupled to receive the first serial scan data from the scan-in node and an output for outputting a time delayed version of the first serial scan data received at the flip flop input in synchronism with said clock pulses;
- a controllable scan-out selector having a first input coupled to the scan-in node, a second input coupled to the output of the serial shift means, a control terminal, and an output coupled to the scan-out node for selectively outputting to the scan-out node a selected one of first and second signals respectively applied to the first and second scan-out selector inputs in response to a scan-out control signal supplied to the scan-out selector control terminal; and
- scan-out selector control means, operatively coupled to the scan-in node and to the controllable scan-out selector, for receiving the bypass control signal from the scan-in node and for outputting the received bypass control signal to the control terminal of the controllable scan-out selector as said scan-out control signal.

11. A method for varying shift time through a serial scan string, where the serial scan string has a plurality of serial scan cells coupled in series to define the serial scan string, each of the cells including a serial shift means for shifting data serially through the cell, said method comprising the steps of:
- providing within at least one of the serial scan cells, a programmable bypass means for electively bypassing the serial shifting operation of the corresponding shift means in response to a bypass control signal programmed into the programmable bypass means;
- shifting a predefined bypass control signal through the serial scan string to a prespecified one of the serial scan cells having a programmable bypass means; and
- programming the programmable bypass means with the predefined bypass control signal shifted thereto.

12. The method of claim 11 wherein:
- said step of providing includes providing each of at least two of the serial scan cells with a corresponding programmable bypass means;
- said step of shifting includes simultaneously shifting at least two predefined bypass control signals through the serial scan string each to a corresponding one of the at least two serial scan ells having programmable bypass means
- said step of programming includes simultaneously programming the at least two programmable bypass means with the predefined bypass control signals shifted thereto.

13. A serial scan string having variable shift length, the serial scan string comprising a plurality of serial scan cells coupled in series, each of the cells including a serial shift means for shifting data serially through the cell, at least one of the serial scan cells including:
- programmable bypass means for electively bypassing the serial shifting operation of the corresponding shift means of the at least one serial scan cell in response to a bypass control signal programmed into the programmable bypass means;
- serial transfer means for serially shifting a predefined bypass control signal through the serial scan string to the programmable bypass means; and
- programming means for programming the programmable bypass means in accordance with the predefined bypass control signal shifted thereto.

* * * * *